United States Patent [19]

Tugcu

[11] Patent Number: 4,717,990
[45] Date of Patent: Jan. 5, 1988

[54] DOUBLE-SHIELDED HOUSING FOR RF CIRCUITRY

[75] Inventor: Mehmet Tugcu, Kastrup, Denmark

[73] Assignee: Motorola, Inc., Schaumburg, Ill.

[21] Appl. No.: 869,154

[22] Filed: May 30, 1986

[51] Int. Cl.4 ............................................. H05K 9/00
[52] U.S. Cl. .................................. 361/424; 174/35 R
[58] Field of Search .................. 361/424; 174/35 MS, 174/35 R

[56] References Cited

U.S. PATENT DOCUMENTS

| | | | |
|---|---|---|---|
| 2,964,683 | 12/1960 | Roman et al. | 361/424 |
| 3,721,746 | 3/1973 | Knappenberger | 174/35 R X |
| 3,816,911 | 6/1974 | Knappenberger | 29/626 |
| 4,159,506 | 6/1979 | Latasiewicz et al. | 361/399 |
| 4,370,700 | 1/1983 | Duddles et al. | 361/424 |
| 4,494,095 | 1/1985 | Noji et al. | 361/424 X |

FOREIGN PATENT DOCUMENTS

| | | |
|---|---|---|
| 0008070 | 8/1979 | European Pat. Off. . |
| 1201435 | 9/1965 | Fed. Rep. of Germany . |
| 12579012 | 1/1968 | Fed. Rep. of Germany . |
| 1261918 | 2/1968 | Fed. Rep. of Germany . |
| 1280355 | 10/1968 | Fed. Rep. of Germany . |
| 1286165 | 1/1969 | Fed. Rep. of Germany . |
| 1938332 | 2/1971 | Fed. Rep. of Germany . |
| 2104549 | 8/1972 | Fed. Rep. of Germany . |
| 3223355 | 1/1983 | Fed. Rep. of Germany . |
| 3445161 | 6/1985 | Fed. Rep. of Germany . |
| 3447347 | 7/1985 | Fed. Rep. of Germany . |
| WO86/01969 | 3/1986 | PCT Int'l Appl. | 361/424 |
| 7510800 | 1/1977 | Sweden . |
| 2101811 | 1/1983 | United Kingdom . |
| 2123216 | 1/1984 | United Kingdom . |

*Primary Examiner*—J. R. Scott
*Assistant Examiner*—Morris Ginsburg
*Attorney, Agent, or Firm*—Douglas A. Boehm; Donald B. Southard; Charles L. Warren

[57] ABSTRACT

An electronic apparatus comprises a housing having walls of an electrically conductive material and together defining an inner space. The walls of the housing comprise outer walls, and partition walls extending from one of the walls of the housing into the inner space of the housing dividing the inner space into different compartments. The apparatus further comprises an electronic circuit board having electronic components mounted thereon and is provided with apertures through which the partition walls extend. In order to shield the electronic circuits of the individual compartments in relation to each other a first shielding component is provided. In order to further shield the circuits of the individual compartments in relation to the environment and vice versa and still further short-circuit any electromagnetic field radiated from the edges of the partition walls and the first shielding component, a further or second shielding component is provided, shielding the individual compartments and the electronic circuits contained within the individual compartments from each other. The outer walls of the housing further shield the electronic circuits of the apparatus from the environment or the surroundings.

12 Claims, 2 Drawing Figures

DOUBLE-SHIELDED HOUSING FOR RF CIRCUITRY

The present invention relates to the electronic field. More specifically, the present invention relates to an electronic apparatus comprising a housing and an electronic circuit board.

BACKGROUND OF THE INVENTION

Within the electronic industry, different kinds of electronic apparatuses of the above type are provided. Within particular fields of the electronic industry, electronic apparatus are provided in which various electronic circuits are included which require shielding from each other and from the environment or surroundings. An example of such a field is the telecommunication field, particularly the radio communication field.

In accordance with the commonly employed shielding technique the individual electronic circuits are shielded from each other and from the environment or surroundings in individual metallic encasings. In one embodiment of this circuit encasing technique, the individual electronic circuits are provided on separate circuits boards, such as printed circuit boards, e.g. single or double-sided printed circuit boards, which are enclosed within individual metallic encasings or housings. However, as the electronic industry is moving towards a miniaturizing of the electronic circuits, involving the technique of providing integrated circuits and further involving the well-known layer techniques, including thick-film technique and thin-film technique, the provision of the individual electronic circuits to be shielded from one another and from the environment or surroundings on separate circuit boards and arranging the individual circuit boards within individual metallic encasings is considered to be an irrational technique which to a great deal counteracts the miniaturizing and integration trend.

In order to solve the problem of combining the miniaturizing and integration technique and the shielding requirements of the electronic circuits which are to be shielded, it has been suggested to arrange the electronic components together constituting the electronic circuits of the apparatus on a single circuit board and to provide shielding of individual electronic circuits in relation to one another and in relation to the environment or surroundings.

In Swedish Pat. No. 75 108 00-1 (publication No. 391 105) the provision of shielding plates is disclosed which are soldered on to the circuit board together with the electronic component and which together define compartments in which the individual electronic circuits are encased. The circuit board including the electronic components and the shielding plates is arranged within the inner space of the apparatus housing which serves the purpose of shielding the electronic circuits in relation to the environment or surroundings. However, this technique is not quite satisfactory since the technique involves the provision of a great number of individual components, viz. the individual shielding plate, which are to be mounted and soldered on to the circuit board. Furthermore, the shielding plates have to provide electrical contact with the apparatus housing and, consequently, contact means serving the purpose of establishing contact between the shielding plates and the apparatus housing has to be provided.

A further problem relating to the technique of providing separate shielding plates soldered on to the circuit board and encasing the electronic circuits also mounted thereon originates from the trend to mount more and more components on the circuit board by arranging components on both sides thereof and soldering the components on to the circuit board in automatized processes such as dip soldering processes or wave soldering processes in which the entire circuit board having all components arranged on both sides thereof is soldered. When employing these automatized soldering processes, the above shielding plates have to be arranged on the side of the circuit board opposite to the side from which the solder is supplied as the individual compartments defined by the shielding plates would be filled out with solder in case it is attempted to supply solder to the side of the circuit board on which the shielding plates are mounted.

In U.S. Pat. No. 4,370,700, it has been suggested to provide a housing having integrally formed perpendicular walls extending outwardly from the housing into the inner space thereof and to arrange the printed circuit board in abutting engagement with the perpendicularly extending walls so that the circuit board is positioned parallel with the base of the housing and the perpendicularly extending walls encircle the circuits which are located on the board and which are to be shielded. However, the shielding effect is highly dependent on the close abutting arrangement of the circuit board relative to the perpendicularly extending walls. Thus, even a minor gap between the outer side surface of the circuit board and the perpendicularly extending wall of the housing may cause deteriorating leakage which to a grreat extent reduces the desired shielding effect. Furthermore, as the shielding walls are arranged on one side of the circuit board exclusively, the shielding effect is reduced as compared to the technique involving individual encasings, enclosing the individual electronic circuits to be shielded.

In German published patent application Nos. DE-OS 34 45 161 and DE-OS 34 47 347, a housing for an electronic apparatus is disclosed. The housing is assembled from thin metal plates which are assemlbed into a rectangular framework further comprising a base plate and a top plate. Within the housing, a circuit board is arranged which is provided with an elongated aperture through which a shielding plate extends. The shielding plate is a thin metal plate component which is of a configuration comprising a central portion and two bent end portions. The bent end portions are adapted to provide electrical contact to the base plate and the top plate of the housing. In order to establish good electrical contact between the shielding components of the housing and further to the circuit board, the circuit board is soldered to the inner wall of the framework and the shielding plate is soldered to the circuit board. Like the above described technique of Swedish Pat. No. 75 108 00-1 the electronic apparatus assembly of these published German patent applications cannot be soldered in an automatized soldering process, such as a dip soldering process or a wave soldering process as the solder would fill out the inner space of the frame or at least part thereof and consequently provide short-circuiting connections between the housing and the circuit tracks or components of the circuit board, and possibly also between the shielding plate and the circuit tracks or components. Furthermore, the soldered connections between the circuit board and the inner wall of the framework and between the shielding plate and the circuit board renders it very difficult to service the electronic apparatus. The technique of the above German published patent applications is, therefore, applicable only for electronic apparatus which is not serviced but simply replaced by an alternative electronic apparatus in case of malfunction or failure.

Therefore, it is an object of the present invention to provide an apparatus of the above described type in which a single electronic circuit board including the electronic circuits is provided and in which the electronic circuits to be shielded from each other are effectively shielded from each other and from the environment or surroundings.

A further object of the present invention is to provide an apparatus of the above described type which may be manufactured by employing automatized processes, such as dip soldering processes or wave soldering processes and which further renders it possible to service the electronic apparatus by demounting the housing, replacing electronic components of the circuit board and reassembling the housing including the circuit board.

SUMMARY OF THE INVENTION

In a first aspect, the present invention provides an electronic apparatus comprising a housing, said housing being an integrally cast housing and being of an electrically conductive material, said housing having outer walls including a base wall and side walls and further having at least one partition wall, said outer walls together defining an inner space, an electronic circuit board, said circuit board being arranged within said inner space and including at least two electronic circuits located at different sections of said circuit board, said circuit board further being provided with at least one aperture separating said sections from each other, said at least one partition wall extending from one of said outer walls into said inner space and through said aperture, so as to substantially divide said inner space into two individual compartments each containing one of said sections of said circuit board, and a first shielding component of an electrically conductive material, said first shielding component being arranged in electrical contact with said housing, so as to substantially close one of said compartments in relation to the other compartment and in relation to the environment and further provide a shielding of said electronic circuit of said substantially closed compartment in relation to the other electronic circuit and in relation to the environment.

In accordance with this aspect of the present invention, the electronic apparatus is simply manufactured from the following components: the integrally cast housing, the circuit board, and the first shielding component. Consequently, the circuit board may in accordance with the teaching of the present invention be provided by employing automatized production processes, such as dip soldering processes or wave soldering processes. It should further be realized that the structure of the electronic apparatus according to te invention does not provide any limitations of the compactness of the electronic circuits of the circuit board, and the electornic apparatus according to the present invention consequently fully benefits from the miniaturizing and integration techniques still fulfilling the shielding requirements of the individual electronic circuits of the apparatus.

It should be realized that the term "base wall" as employed in the present context merely defines a particular outer wall of the housing in relation to the other outer walls of the housing. Thus, the term does not imply that the base wall is the base or bottom of the apparatus when the electronic apparatus is in use. Thus, the base wall may constitute the top, the side, the rear, or the front wall of the apparatus or an oblique wall of the apparatus, when the apparatus is in use.

In the HF and RF field the provision of double-shielding is in itself a well-known technique. The term "double-shielding" as employed in the present context involves the provision of a first, substantially closed shielding compartment including a first electronic circuit of the electronic apparatus which first electronic circuit is to be shielded in relation to other electronic circuits of the electronic apparatus and in relation to the environment, and the provision of a second, substantially closed compartment including said first electronic circuit of the electronic apparatus so as to shield said first electronic circuit twice by short-circuiting any electromagnetic fields irradiated from the edges of said first shielding compartment to the housing.

The provision of double-shielded electronic apparatus has hitherto involved the adaptation of the above described techniques to the double-shielding concept, i.e. the double-shielding has been provided by first arranging the electronic circuit to be double-shielded in a separate shielding compartment by employing the above described inadequate techniques and by arranging the separately shielded first electronic circuit and the other electronic circuits of the apparatus in a shielding compartment by further employing the above described inadequate shielding techniques. Therefore the provision of the double-shielded electronic circuits is highly advantageous from a technical point of view.

In accordance with a second aspect, the present invention provides an electronic apparatus comprising a housing having outer walls of an electrically conductive material and including a base wall and side walls and further having at least one partition wall of an electrically conductive material, said outer walls together defining an inner space of said housing, an electronic circuit board, said electronic circuit board being arranged within said inner space and including at least two electronic circuits located at diferent sections of said circuit board, said circuit board further being provided with at least one aperture separting said sections from each other, said at least one partition wall extending from one of said outer walls into said inner space of the housing and through said aperture of the circuit board, so as to substantially divide said inner space of said housing into at least two individual compartments each containing one of said sections of said circuit board a first shielding component of an electrically conductive material, said first shielding component being arranged in electrical contact with said housing, so as to substantially close one of said compartments in relation to the other compartment and in relation to the the environment, and a second shielding component of an electrically conductive material, said second shielding component being arranged in electrical contact with said housing, so as to substantially close said housing in relation to the environment and further provide a double-shielding of at least one of said electronic circuits.

In accordance with a preferred embodiment of the apparatus according to the invention, the outer walls are preferably of generally rectangular configurations, and the side walls extend generally perpendicularly from the base wall. In this preferred embodiment of the apparatus according to the invention, the partition wall preferably extends generally perpendicularly from the base wall.

Although the circuit board may be arranged in any orientation in relation to the outer walls and the partition wall of the housing and fastened in said orientation in any appropriate manner, e.g. by means of conventional fastening means, such as screws, bolts etc., the circuit board is preferably arranged generally parallel to the base wall which as mentioned above may constitute a top, a side, a front, a rear, or a bottom wall of the apparatus housing when the apparatus is in use.

The apparatus according to the invention may further have its housing provided with a top wall arranged opposite the base wall. The top wall of the housing may to some extent provide a shielding effect, however, the top wall mainly serves the purpose of mechanically protecting the shielding components and the electronic circuits of the apparatus.

Although the aperture of the circuit board may be of any appropriate configuration, the aperture of the circuit board in accordance with the presently preferred embodiment of the invention is preferably of a substantially elongated configuration or composed of segments of substanstially elongated configurations.

Although the individual electronic circuits located at different sections of the circuit board may be totally independent of each other and operate independently of each other, the teaching of the present invention renders it possible to provide said at least two circuits adapted to cooperate elecronically, and to provide the electronic circuit board provided with a circuit interconnecting said sections of the circuit board, as the shielding of the electronic circuit is accomplished by the partition wall extending through the aperture of the circuit board.

The teaching of the present invention may be combined with any of the well-known circuit board techniques, including printed circuit boards, either single-sided or double-sided printed circuit boards, multi-layer printed circuit boards and layer techniques, such as thin-layer technique and thick-layer technique, involving the provision of the circuit board as a thick-film substrate.

BRIEF DESCRIPTION OF THE DRAWING

The invention will now be further described with reference to the drawings, wherein.

DESCRIPTION OF THE PREFERRED EMBODIMENT

Figure 1:
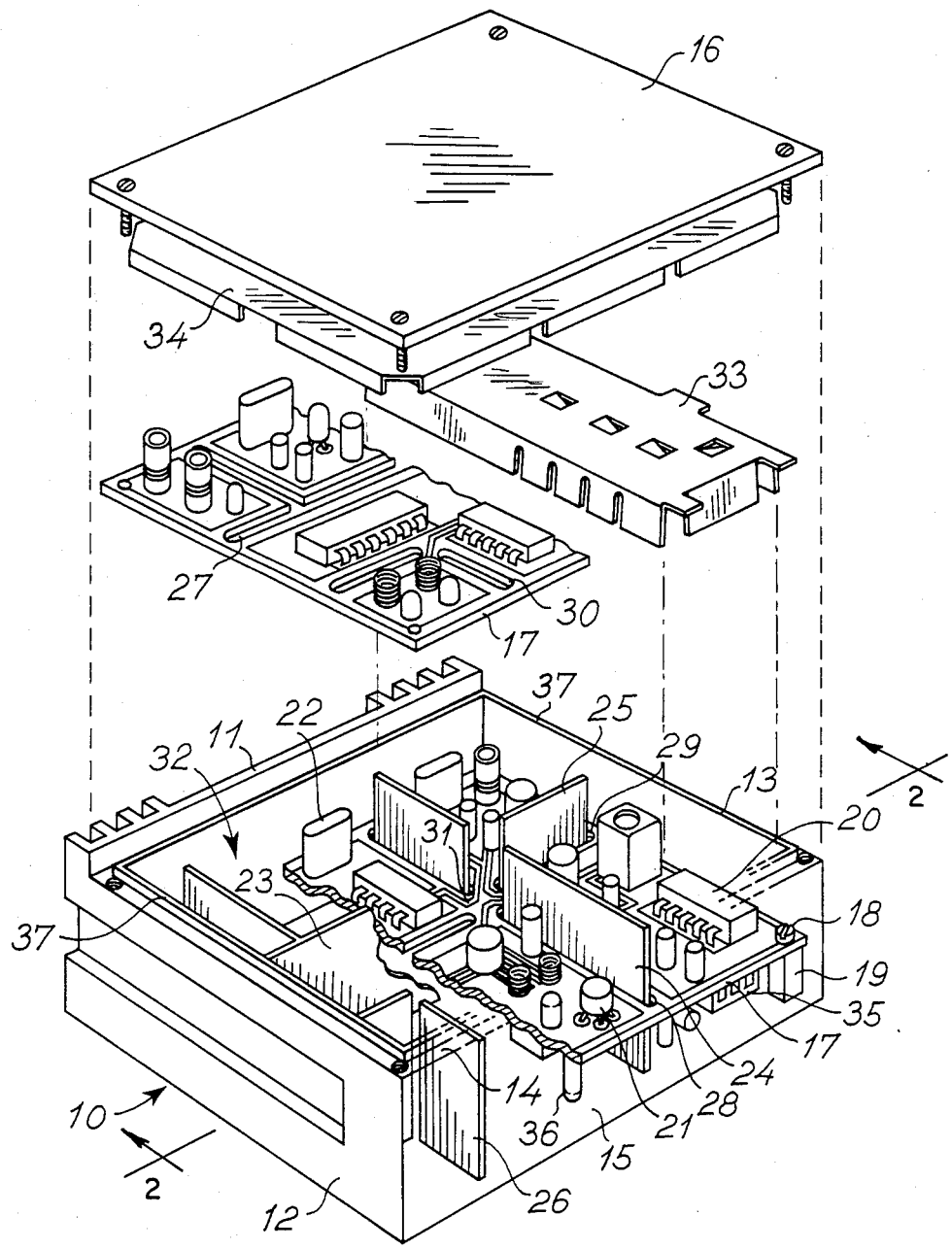
FIG. 1 is a perspective, partially cut-away view of a preferred embodiment of an electronic apparatus according to the invention.

In the drawings, an apparatus housing designated 10 in its entirety is shown. The housing 10 is an integrally cast housing and comprises a rear wall 11 which further constitutes a heat sink of the apparatus and is provided with protruding heat radiating fins, side walls 12 and 13, a front wall 14 which is partially shown in dotted line, a base wall 15, and a detachable cover 16 constituting the top wall of the housing. The outer walls 11–16 of the apparatus housing 10 defines an inner space 32 of the housing. Within the inner space 32, a printed circuit board 17 is arranged. As is evident from the drawing, the printed circuit board 17 is fastened to the base wall 15 of the apparatus housing by means of screws, one of which is shown in FIG. 1 and designated the reference numeral 18, and distance pieces, one of which is shown in FIG. 1 and designated the reference numeral 19.

On the upper side surface of the printed circuit board 17 electronic components, including an integrated circuit designated 20, a transistor designated 21, and a capacitor 22, are arranged and soldered on to circuit tracks of the printed circuit board. Apart from the electronic components arranged on the upper side surface of the printed circuit board 17, the printed circuit board further has electronic components arranged on the lower side surface of the printed circuit board. Two of these components are designated the reference numerals 35 and 36.

Figure 2:
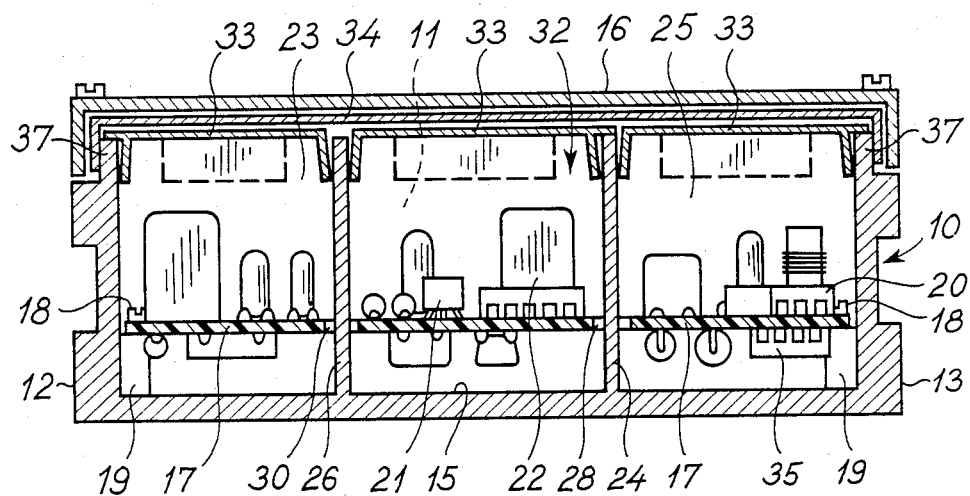
FIG. 2 is a vertical sectional view along line 2—2 of the preferred embodiment of the apparatus according to the invention shown in FIG. 1.

The integrally cast housing 10 further comprises inner partition walls which extend from the base wall 15 of the housing into the inner space 32 of the housing. Four of these partition walls are designated the reference numerals 23–26. The circuit board 17 is further provided with apertures through which the partition walls extend. Four of these apertures are designated the reference numerals 27–30. As is evident from FIG. 1, the apertures are generally of an elongated configuration or combined of segments of an elongated configuration, such as the aperture designated 27. As will be understood, the partition walls divide the inner space 32 of the housing into a plurality of compartments each including a separate circuit section of the electronic circuit of the apparatus. In order to shield the electronic circuits of the individual compartments in relation to each other, shielding components are provided which substantially close the individual compartments. In FIG. 1 only one of these shielding components is shown designated 33, whereas a total of three such shielding components are shown in FIG. 2. The shielding components 33 serve the purpose of separating and shielding the electronic circuit of the individual compartment in relation to each other. The shielding components 33 are of a basically elongated, inverse trough configuration. From the ends of the shielding components flaps protrude which serve the purpose of resting against inner edges of the front wall 14 and the rear wall 11 within a circumferentially protruding rim portion 37 of the apparatus housing 10. The shielding component 33 is made of resilient metallic plate. In order to further sield the electronic circuits of the apparatus in relation to the environment and further short circuiting any electromagnetic fields irradiated from the edges of the partition walls 23–26, a further shielding component 34 is provided which is adapted to be maintained in position by the above mentioned circumferentially protruding rim portion 37. Whereas the shielding components 33 and 34 serve the purpose of shielding the electronic circuits within the individual compartments of the housing in relation to each other and further in relation to the environment and still further eliminate any influence from the environment to the electronic circuit, the detachable cover 16 of the housing serves only the purpose of protecting the shielding components 33 and 34 and further the electronic components of the apparatus and further the purpose of providing an attractive appearance of the entire apparatus.

Although the electronic circuits of the individual compartments of the inner space 32 are to be separated and shielded in relation to each other, the electronic circuits still have to electronically cooperate with each other. Serving this purpose, printed circuit tracks are provided which interconnect the electronic circuits of the individual compartments with each other. One of these circuit tracks is designated the reference numeral 31.

In FIG. 2, a vertical sectional view along the line 2—2 of FIG. 1 is shown. From FIG. 2 the structure of the first and second shielding components 33 and 34, respectively, is apparent.

EXAMPLE

In a mobile radio transmitter implementation of the electronic apparatus according to the invention, the housing 10 was cast from aluminum. The dimensions of the housing were: height: 52.5 mm, width: 177.5 mm, and depth: 142.5 mm. The thickness of the outer walls 11–14 was 6.5 mm, and the thickness of the base wall 15, which was detachable and identical to the cover 16, and of the cover 16 was 1 mm. The thickness of the partition walls 23–26 was 1.5 mm. The shielding components 33 and 34 were made from 0.1 mm nickel silver. The circuit board 17 was a conventional double-sided 1.5 mm printed circuit board.

It is to be understood, that numerous modifications are possible and obvious to the skilled art worker and are to be included within the scope of the appending claims.

I claim:

1. An electronic apparatus comprising a housing, said housing being an integrally cast housing and being of an electrically conductive material, said housing having outer walls including a base wall and side walls and further having at least one partition wall, said outer walls together defining an inner space of said housing, an electronic circuit board, said circuit board being removably fastened within said inner space and including at least two electronic circuits located at different sections of said circuit board, said circuit board further being provided with at least one aperture separting said sections from each other, at least one partition wall extending from one of said outer walls into said inner space through said aperture, so as to subtantially divide said inner space into two individual compartments each containing one of said sections of said circuit board, and a first shielding component of an electrically conductive material, said first shielding component being arranged in electrical contact with said housing, so as to substantially close only one of said individual compartments in relation to the other compartment an in relation to the environment, and further provide a shielding of one electronic circuit when the substantially closed compartment in relation to the other electronic circuit and in relation to the environment.

2. An apparatus according to claim 1, further comprising a second shielding component of an electrically conductive material, said second shielding component being arranged in electrical contact with said housing, so as to substantially close said housing in relation to the environment and further provide a double-shielding of at least one of said electronic circuits.

3. An apparatus according to claim 1, said outer walls being of generally rectangular configurations and said side walls extending generally perpendicularly from said base wall.

4. An apparatus according to claim 1, said partition wall extending generally perpendicularly from said base wall.

5. An apparatus according to claim 1, said circuit board being arranged generally parallel to said base wall.

6. An apparatus according to claim 1, said housing further having a top wall arranged opposite to said base wall.

7. An apparatus according to claim 6, said circuit board being mounted on and fastened to said base wall, and the top wall being removable.

8. An apparatus according to claim 1, said at least one aperture being of a substantially elongated configuration.

9. An apparatus according to claim 1, said at least two circuits being adapted to electronically cooperate, and said electronic circuit board being provided with a circuit interconnecting said sections of said circuit board.

10. An apparatus according to claim 1, said circuit board being a thick-film substrate.

11. An apparatus according to claim 1, said circuit board being a printed circuit board.

12. An apparatus according to claim 11, said printed circuit board being a double-sided printed circuit board.

* * * * *